United States Patent
Linderman et al.

(10) Patent No.: US 8,336,539 B2
(45) Date of Patent: Dec. 25, 2012

(54) OPPOSING ROW LINEAR CONCENTRATOR ARCHITECTURE

(75) Inventors: Ryan Linderman, Oakland, CA (US); Zachary S. Judkins, Berkeley, CA (US); Brian Wares, San Francisco, CA (US); Charles Almy, Berkeley, CA (US)

(73) Assignee: Sunpower Corporation, San Jose, CA (US)

( * ) Notice: Subject to any disclaimer, the term of this patent is extended or adjusted under 35 U.S.C. 154(b) by 249 days.

(21) Appl. No.: 12/849,606

(22) Filed: Aug. 3, 2010

(65) Prior Publication Data
US 2012/0031394 A1 Feb. 9, 2012

(51) Int. Cl.
*F24J 2/10* (2006.01)
*G02B 5/10* (2006.01)

(52) U.S. Cl. ........................................ 126/696; 359/853

(58) Field of Classification Search ............... 359/850, 359/851, 852, 853, 855, 864, 871, 867; 126/684, 126/690, 692, 694, 696, 685, 702; 136/246; 353/3; 250/203.4
See application file for complete search history.

(56) References Cited

U.S. PATENT DOCUMENTS

| | | | |
|---|---|---|---|
| 4,153,474 A | 5/1979 | Rex | |
| 4,323,719 A | 4/1982 | Green | |
| 4,373,783 A | 2/1983 | Anderson | |
| 4,456,332 A | 6/1984 | Anderson | |
| 4,468,848 A | 9/1984 | Anderson et al. | |
| 4,468,849 A | 9/1984 | Anderson et al. | |
| 4,481,378 A | 11/1984 | Lesk | |
| 4,502,200 A | 3/1985 | Anderson et al. | |
| 4,640,734 A | 2/1987 | Roberts et al. | |
| 4,643,543 A | 2/1987 | Mohn et al. | |
| 4,643,544 A | 2/1987 | Loughran | |
| 4,759,803 A | 7/1988 | Cohen | |
| 5,180,441 A | 1/1993 | Cornwall et al. | |
| 5,248,346 A | 9/1993 | Fraas et al. | |
| 5,334,496 A | 8/1994 | Pond et al. | |
| 5,344,496 A | 9/1994 | Stern et al. | |
| 5,389,158 A | 2/1995 | Fraas et al. | |
| 5,409,549 A | 4/1995 | Mori | |
| 5,498,297 A | 3/1996 | O'Neill et al. | |
| 5,580,395 A | 12/1996 | Yoshioka et al. | |
| 5,616,185 A | 4/1997 | Kukulka | |

(Continued)

FOREIGN PATENT DOCUMENTS

DE  10041271  3/2002

(Continued)

OTHER PUBLICATIONS

International Search Report and Written Opinion of PCT/US2011/044750, filed Jul. 20, 2011.

(Continued)

*Primary Examiner* — Stephone Allen
*Assistant Examiner* — Kimberly N Kakalec
(74) *Attorney, Agent, or Firm* — Knobbe Martens Olson & Bear LLP

(57) ABSTRACT

A solar concentrator assembly is disclosed. The solar concentrator assembly comprises a first reflective device having a first reflective front side and a first rear side, a second reflective device having a second reflective front side and a second rear side, the second reflective device positioned such that the first reflective front side faces the second rear side, and a support assembly coupled to and supporting the first and second reflective devices, the second reflective device positioned to be vertically offset from the first reflective device.

16 Claims, 4 Drawing Sheets

U.S. PATENT DOCUMENTS

| | | | |
|---|---|---|---|
| 5,660,644 | A | 8/1997 | Clemens |
| 5,697,192 | A | 12/1997 | Inoue |
| 5,865,905 | A | 2/1999 | Clemens |
| 5,899,199 | A | 5/1999 | Mills |
| 5,979,438 | A * | 11/1999 | Nakamura .................... 126/680 |
| 5,990,415 | A | 11/1999 | Green et al. |
| 6,034,322 | A | 3/2000 | Pollard |
| 6,131,565 | A | 10/2000 | Mills |
| 6,323,478 | B1 | 11/2001 | Fujisaki et al. |
| 6,359,209 | B1 | 3/2002 | Glenn et al. |
| 6,442,937 | B1 | 9/2002 | Stone |
| 6,553,729 | B1 | 4/2003 | Nath et al. |
| 6,635,507 | B1 | 10/2003 | Boutros et al. |
| 6,662,801 | B2 | 12/2003 | Hayden et al. |
| 7,468,485 | B1 | 12/2008 | Swanson |
| 7,554,031 | B2 | 6/2009 | Swanson et al. |
| 7,709,730 | B2 | 5/2010 | Johnson et al. |
| 7,820,906 | B2 | 10/2010 | Johnson et al. |
| 7,825,327 | B2 | 11/2010 | Johnson et al. |
| 7,932,461 | B2 | 4/2011 | Johnson et al. |
| 7,952,057 | B2 | 5/2011 | Finot et al. |
| 7,968,791 | B2 | 6/2011 | Do et al. |
| 8,039,777 | B2 | 10/2011 | Lance et al. |
| 8,049,150 | B2 | 11/2011 | Johnson et al. |
| 8,071,930 | B2 | 12/2011 | Wylie et al. |
| 8,083,362 | B2 | 12/2011 | Finot et al. |
| 2002/0075579 | A1 * | 6/2002 | Vasylyev et al. ............... 359/853 |
| 2004/0074490 | A1 | 4/2004 | Mills et al. |
| 2007/0151598 | A1 | 7/2007 | De Ceuster et al. |
| 2007/0257274 | A1 | 11/2007 | Martter et al. |
| 2008/0035198 | A1 | 2/2008 | Teppe et al. |
| 2009/0056699 | A1 | 3/2009 | Mills et al. |
| 2009/0056785 | A1 | 3/2009 | Johnson et al. |
| 2009/0056786 | A1 | 3/2009 | Johnson et al. |
| 2009/0056787 | A1 | 3/2009 | Johnson et al. |
| 2009/0095284 | A1 | 4/2009 | Klotz |
| 2009/0139557 | A1 | 6/2009 | Rose et al. |
| 2009/0173375 | A1 | 7/2009 | Frazier et al. |
| 2010/0154788 | A1 | 6/2010 | Wells et al. |
| 2010/0163014 | A1 | 7/2010 | Johnson et al. |
| 2010/0175740 | A1 | 7/2010 | Johnson et al. |
| 2010/0193014 | A1 | 8/2010 | Johnson et al. |
| 2010/0236626 | A1 | 9/2010 | Finot et al. |
| 2010/0294336 | A1 | 11/2010 | Johnson et al. |
| 2010/0319682 | A1 | 12/2010 | Klotz |
| 2011/0023940 | A1 | 2/2011 | Do et al. |
| 2011/0108090 | A1 * | 5/2011 | Lance et al. .................. 136/246 |
| 2011/0132457 | A1 | 6/2011 | Finot |
| 2011/0186130 | A1 | 8/2011 | Finot et al. |
| 2011/0226309 | A1 | 9/2011 | Do et al. |
| 2011/0226310 | A1 | 9/2011 | Johnson et al. |
| 2011/0265869 | A1 | 11/2011 | Finot et al. |

FOREIGN PATENT DOCUMENTS

| | | |
|---|---|---|
| DE | 202004005198 | 8/2004 |
| GB | 2340993 | 3/2000 |
| JP | 2007184542 | 7/2007 |
| JP | 2007194521 | 8/2007 |
| JP | 2007214247 | 8/2007 |
| KR | 1020070070183 | 7/2007 |
| KR | 1020090014153 | 2/2009 |
| WO | WO9957493 | 11/1999 |
| WO | WO2007096157 | 8/2007 |
| WO | WO2007096158 | 8/2007 |
| WO | WO2008022409 | 2/2008 |
| WO | WO2008153922 | 12/2008 |
| WO | WO2009023063 | 2/2009 |
| WO | WO2009029275 | 3/2009 |
| WO | WO2009029277 | 3/2009 |

OTHER PUBLICATIONS

Bardwell, Karen et al., "Minimizing End Shadowing Effects on Parabolic Concentrator Arrays," IEEE, 1980, pp. 765-770.

Carroll, Don et al. "Production of the Alpha Solarco Proof-of-Concept Array," IEEE, 1990, pp. 1136-1141.

Edenburn, Michael W., et al. "Shading Analysis of a Photovoltaic Cell String Illuminated by a Parabolic Trough Concentrator," IEEE, 1981, pp. 63-68.

Quagan, Robert J., "Laser Diode Heat Spreaders," Ion Beam Milling, Inc., website copyright 2010, http://www.ionbeammilling.com/default.asp, 9 pgs.

Shepard, Jr., N. F. et al., "The Integration of Bypass Diodes with Terrestrial Photovoltaic Modules and Arrays," IEEE, 1984, pp. 676-681.

Stern, T. G., "Interim results of the SLATS concentrator experiment on LIPS-II (space vehicle power plants)," Photovoltaic Specialists Conference, 1988., Conference Record of the Twentieth IEEE, vol., No., pp. 837-840 vol. 2, 1988. URL: http://ieeexplore.ieee.org/stamp/stamp.jsp?tp=&arnumber=105822&isnumber=3239.

Vivar Garcia, Marta, "Optimisation of the Euclides Photovoltaic Concentrator," 2009, 390 pages.

* cited by examiner

OPPOSING ROW LINEAR CONCENTRATOR ARCHITECTURE

TECHNICAL FIELD

Embodiments of the subject matter described herein relate generally to solar concentrators. More particularly, embodiments of the subject matter relate to concentrator component arrangements.

BACKGROUND

One challenge encountered during assembly and operation of a solar concentrator is weight distribution. Solar concentrator arrays are frequently mounted to, and have their position adjusted at, a central post or pier. Such concentrator arrays typically have a support structure with a lateral member, such as a crossbeam or strut. The lateral member is typically coupled directly to the post, usually by a positioning mechanism. In turn, several concentrator elements are coupled to the lateral member, and are supported by it.

As a consequence of the components' position above the lateral member, the center of gravity of the concentrator array is above the post, and, consequently, above the positioning mechanism. When the concentrator array rotates to certain positions, the concentrator array can experience an undesirable moment at the positioning mechanism caused by the position of the center of gravity relative to the positioning mechanism. Traditionally, this is offset by a counterweight, which increases the overall weight of the system and increases cost, among other undesirable effects.

Additionally, the arrangement of concentrator elements is usually optimized to reduce or eliminate losses to inefficient ground cover, and the associated overall system cost increase. The ratio of concentrator aperture to area of ground covered therefore is preferably increased as high as possible. One way this can be done is with numerous concentrator elements covering the available ground. Dense concentrator elements can present numerous challenges to efficient power conversion.

BRIEF SUMMARY

A solar concentrator assembly is disclosed. The solar concentrator assembly comprises a first reflective device having a first reflective front side and a first rear side, a second reflective device having a second reflective front side and a second rear side, the second reflective device positioned such that the first reflective front side faces the second rear side, and a support assembly coupled to and supporting the first and second reflective devices, the second reflective device positioned to be vertically offset from the first reflective device.

Another embodiment of a solar concentrator assembly is disclosed. The solar concentrator assembly comprises a torque tube having a long axis, a crossbeam extending in a direction transverse to the long axis, a first reflective device having a first reflective surface facing outward from the torque tube and a first rear side facing toward the torque tube, the first reflective device supported by the crossbeam at a first height, and a second reflective device having a second reflective surface facing outward from the torque tube, the second reflective device positioned in front of the first reflective surface and supported by the crossbeam at a second height, the second height greater than the first height.

An embodiment of a solar array is also disclosed. The solar array comprises a crossbeam extending along a first axis, a torque tube intersecting the crossbeam near the center of the crossbeam, the torque tube extending along a second axis, the second axis substantially transverse to the first axis, a first solar concentrating device coupled to the crossbeam at a first height, and a second solar concentrating device coupled to the crossbeam at a second height, the second solar concentrating device further along the crossbeam from the torque tube than the first solar concentrating device, and the second height higher than the first height.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 5:
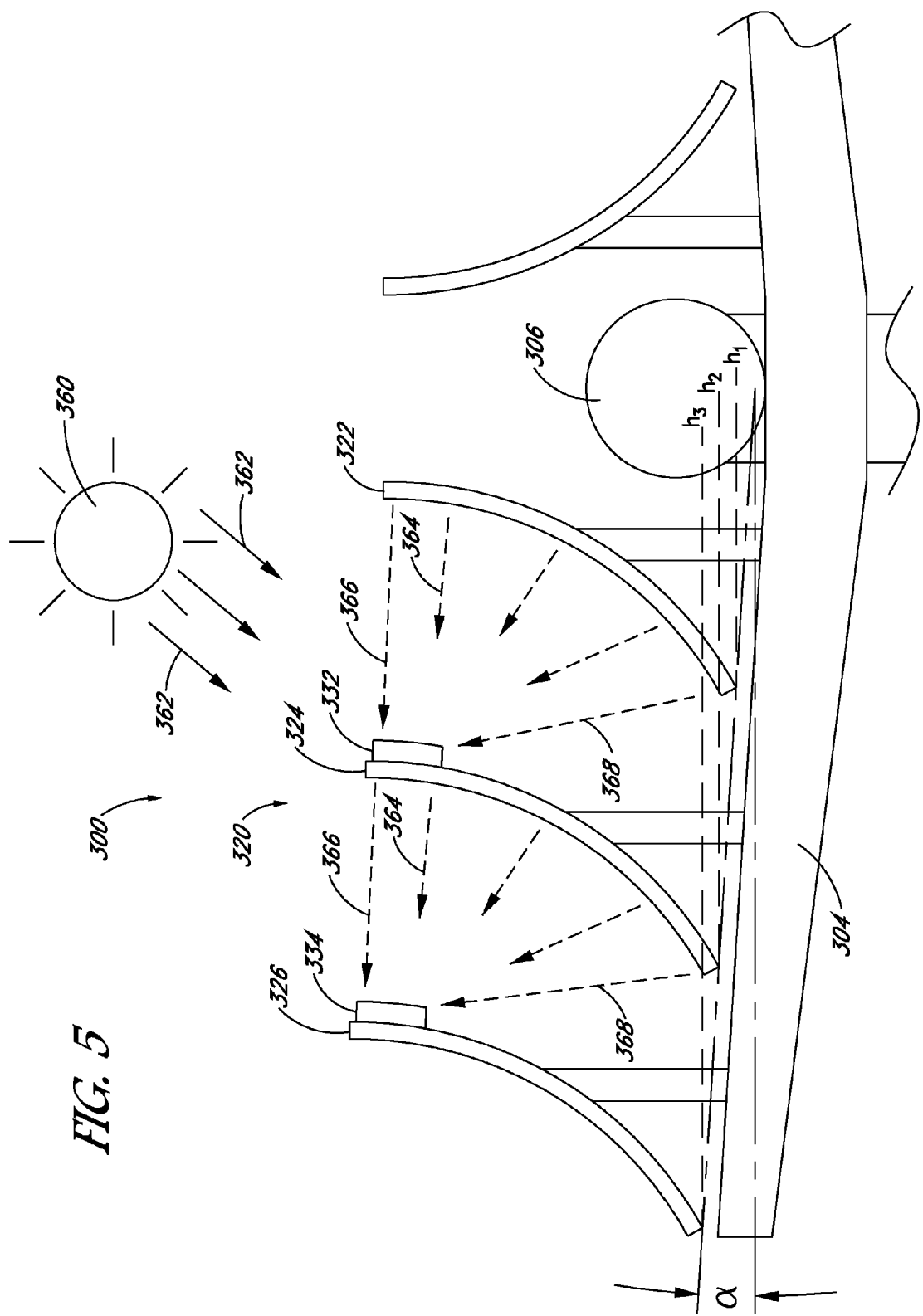
FIG. 5 is a detailed side view of an embodiment of a solar concentrator array.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematic shown in FIG. 5 depicts one exemplary arrangement of elements, additional intervening elements, devices, features, or components may be present in an embodiment of the depicted subject matter.

"Adjust"—Some elements, components, and/or features are described as being adjustable or adjusted. As used herein, unless expressly stated otherwise, "adjust" means to position, modify, alter, or dispose an element or component or portion thereof as suitable to the circumstance and embodiment. In certain cases, the element or component, or portion thereof, can remain in an unchanged position, state, and/or condition as a result of adjustment, if appropriate or desirable for the embodiment under the circumstances. In some cases, the element or component can be altered, changed, or modified to a new position, state, and/or condition as a result of adjustment, if appropriate or desired.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Solar concentrator elements can be arranged to provide nearly complete ground cover. Typical concentrator arrays have a center of gravity offset from a rotational axis of the array. As a result of this offset, when the concentrator array is rotated such that the center of gravity is not directly above the rotational axis, such as during sun tracking, a moment is created about the rotational axis. This moment can increase the difficulty of properly aligning the concentrator array, thereby reducing efficiency. To counter this moment, some concentrator arrays have a counterweight, which adds to system cost and weight, neither of which are desirable.

Moreover, concentrator arrays typically have successive rows of concentrating elements. Some such arrays have solar receiver elements mounted to concentrator elements to conserve space and preserve ground cover. A level array of such concentrator/receiver pairs introduces undesirable paths for concentrated light to travel. For example, the light travel distance from a concentrator reflective surface to a receiver element may be different for light reflected from opposite sides of the reflective surface. This difference can introduce undesirable characteristics, such as intensity variation during slight misalignment. Additionally, an edge can reflect light to the solar receiver at an undesirably steep angle, which can reduce the optical transmission efficiency of the system. Steep angles of incidence occurring at the reflective surface also reduce optical transmission efficiency.

To inhibit these undesirable effects, solar concentrators can be arranged to have the center of gravity of the concentrator array positioned along the axis of rotation of the array. This reduces or eliminates the moment that would be caused by an offset center of gravity. To prevent loss of ground cover that would be caused by positioning a rotational member, such as a torque tube among concentrator elements, the concentrator elements can be arranged such that half face in one direction, the other half in the opposite direction, with the torque tube positioned between.

Additionally, the concentrator elements can be offset in a vertical direction from each other, rising higher out of a level horizontal plane, the farther they are positioned from the torque tube. This offset can reduce the difference in light travel distance between opposite edges of the concentrator's reflective surface. Moreover, the angle of light impinging on the solar receiver, relative to the surface of the solar receiver, is adjusted to reduce the angle, and thereby lessen scattering and transmission losses. The vertical offset of the concentrator elements also allows for a reflector design with a smaller angle of light incidence upon the surface, thus reducing optical transmission losses from this element.

Figure 1:
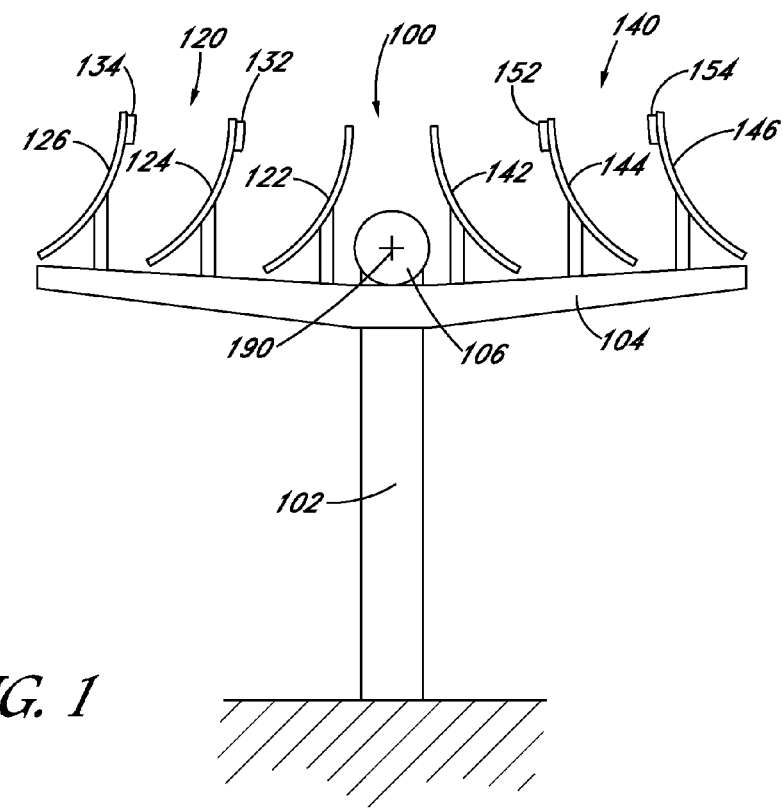
FIG. 1 is a side view of an embodiment of a solar concentrator system.
Figure 2:
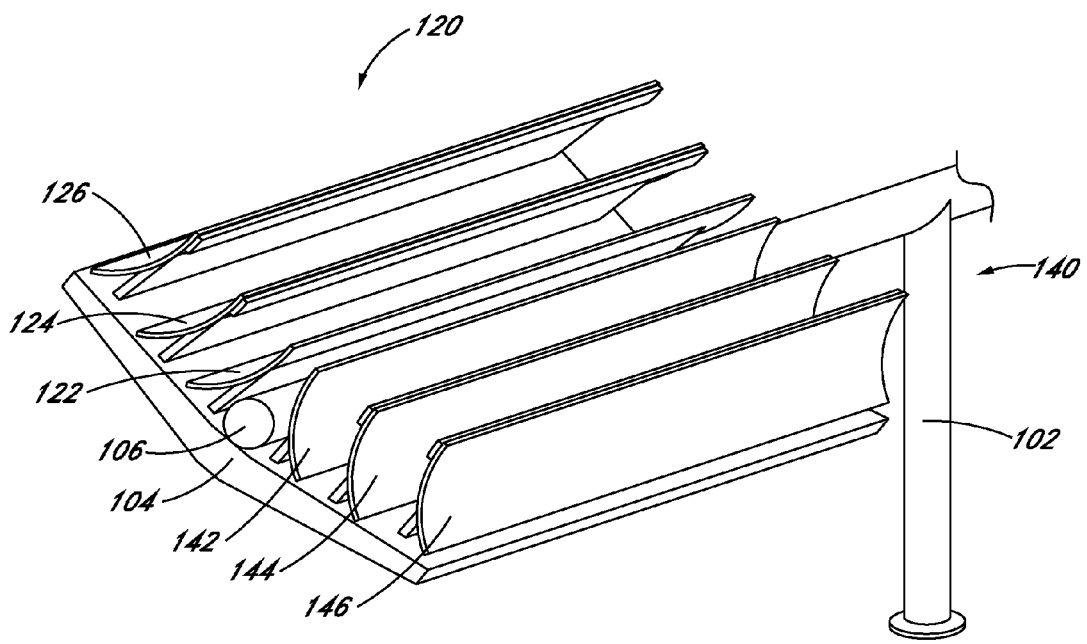
FIG. 2 is a perspective view of the solar concentrator system of FIG. 1.

FIGS. 1 and 2 illustrate an embodiment of a solar concentrator array or assembly 100. The drawings contained herein are for descriptive purposes and may not be to scale. Certain features may be exaggerated for explanation. The solar concentrator assembly 100 comprises a pier or post 102 which supports a crossbeam 104 and torque tube 106. The crossbeam 104 in turn supports first and second groups of concentrator elements 120, 140. The first group of concentrator elements 120 face in one direction, while the second group of concentrator elements 140 are positioned facing the opposite direction, with the changeover between them occurring at the torque tube 106. Certain elements are shown, while others are omitted for clarity and descriptive purposes, as will be explained in greater detail below.

The post 102 can be a single post or one of several supporting the solar concentrator assembly. The post 102 is preferably anchored within a foundation in the ground to support it. The post 102 can be a solid or hollow member of sufficient size and cross-sectional characteristics to support the solar concentrator assembly 100. The post 102 can be formed of a metal, such as steel, aluminum, and similar high-strength metals, or alternative material. For example, concrete or ceramic can be used in some embodiments, as desired.

When groups of concentrator elements are positioned laterally adjacent each other to extend the solar concentrator assembly 100, multiple posts 102 can be used, spaced appropriately, to support the entire arrangement. Thus, although only one group of concentrator elements is shown facing each direction in FIGS. 1 and 2, more groups can be positioned along the torque tube 106, extending the solar concentrator assembly 100. Posts 102 can be positioned between every concentrator element group or spaced further apart, as desired.

The crossbeam 104 is supported by the post 102 and torque tube 106. As explained in greater detail below, the crossbeam 104 can have a substantially horizontal shape, which can include an upwardly-angled portion for positioning individual concentrator elements. The crossbeam 104 can be one of several crossbeams or cross-pieces which support a given concentrator element group. Thus, although one crossbeam 104 is shown, several lateral members can support a single concentrator element successively along the torque tube 106. The crossbeam is preferably made from a high-strength metal such as steel, although other materials can be used, as desired.

The rotational member, or torque tube 106, can be mounted to, and supported by, the post 102. The torque tube 106 is preferably mounted by or to a bearing or bushing or other assembly permitting rotation of the torque tube 106 along its long axis. In some embodiments, a motor or other driving device can be situated between the post 102 and torque tube 106 to adjust the position of the torque tube 104, and correspondingly, the position of the concentrator element groups 120, 140. The torque tube 106 is preferably a hollow tube with a circular cross-section, although other shapes and geometries can be used if preferred, including elliptical or solid shafts. The torque tube 106 has a long axis extending along its length. The long axis extends through the center of the cross-section of the torque tube 106 and the torque tube rotates around it.

The torque tube 106 can extend through multiple concentrator element groups, including extending substantially entirely along the width of the concentrator elements, either as a unitary piece or by coupling together similar tubes. Thus, although the torque tube 106 is shown with two concentrator element groups 120, 140, there can be other element groups adjacent these, up to an appropriate limit. The torque tube 106 preferably can support the weight of the crossbeam 104 and concentrator element groups 120, 140 with minimal elastic or inelastic deforming, thereby inhibiting alignment error into the solar concentrator assembly 100. The torque tube 106 is preferably rigidly mounted to the crosspieces, including crossbeam 104, such that rotating the torque tube 106 around its long axis similarly rotates the crosspieces.

The solar concentrator element groups 120, 140, directly or indirectly, are coupled to and supported by the crossbeam 104 and torque tube 106. The first concentrator element group 120 is composed of the first, second, and third concentrator elements 122, 124, 126. The second concentrator group 140 is composed of fourth, fifth, and sixth concentrator elements 142, 144, 146. Each concentrator element 122, 124, 126, 142, 144, 146 has a front, reflective side and a rear side. The reflective side can be, or can include, a mirror shaped according to the geometric characteristics of the concentrator/receiver combination to provide concentrated sunlight on the solar receiver. The concentrator elements 122, 124, 126, 142, 144, 146 receive unconcentrated sunlight and reflect it to a solar receiver, while concentrating it to a smaller area than the reflective surface. Preferably, the concentrator elements 122, 124, 126, 142, 144, 146 have a parabolic shape, as shown, although other shapes can be used.

For descriptive purposes, certain aspects of the solar concentrator assembly 100 are illustrated not entirely to scale, in a different position, or in a different orientation than they may appear in certain embodiments. For example, concentrator elements 122, 142 are illustrated with a greater vertical position than might be the case in some embodiments. Thus, in certain embodiments, the concentrator elements 122, 142 may extend substantially entirely over the torque tube 106, thereby reducing the amount of sunlight which falls between them and increasing the amount captured by the concentrator elements 122. Similarly, all concentrator elements 122, 124, 126, 142, 144, 146 can have such different orientations.

The first concentrator element 122 reflects concentrated sunlight to the first solar receiver 132. The second concentrator element 124 reflects concentrated sunlight to the second solar receiver 134. The third concentrator element 126 can also direct concentrated sunlight to a receiver mounted on the crossbeam 104, although it has been omitted for clarity. Similarly, the fourth and fifth concentrator elements 142, 144 can direct concentrated sunlight to the third and fourth solar receivers 152, 154, with the solar receiver corresponding to the sixth concentrator element 146 omitted for clarity. The omitted solar receivers corresponding to the third and sixth concentrator elements 126, 146 can be positioned at heights and in orientations necessary to cooperate with certain techniques described herein. Thus, the offset for the omitted receivers can correspond to the offset between the first and second solar receivers 132, 134 in a concentrator row.

Each solar receiver 132, 134, 152, 154 can be mounted to the rear side of a concentrator element, as shown. The solar receivers 132, 134, 152, 154 can comprise a photovoltaic solar cell, diode, interconnect, thermal adhesive, heat spreading device, encapsulant, frame, junction box and/or micro-inverter, and other components as appropriate or desired for efficiently converting received concentrated sunlight to power, including electrical power. In some embodiments, the solar receivers can comprise back-contact, back junction solar cells, while in others, front-contact or other cells can be used. In certain embodiments, the solar receivers 132, 134, 152, 154 can be supported independently from the concentrator elements, such as by a support assembly coupled to the crossbeam 104.

Each solar receiver 132, 134, 152, 154 is preferably coupled to a concentrator element in a position such that reflected, concentrated sunlight impinges it at a predetermined angle. It is desirable that the incoming concentrated sunlight impinges at a 90° angle to the surface of the solar receiver 132, 134, 152, 154. Thus, each solar receiver is preferably mounted in such a position that the surface of each solar receiver 132, 134, 152, 154 is at a right angle, or as nearly a right angle as practicable, to the anticipated angle of impinging concentrated sunlight from each concentrator element 122, 124, 126, 142, 144, 146, as will be explained in greater detail below.

Because the solar concentrator assembly 100 operates most efficiently when the maximum available sunlight is received by the concentrator elements 122, 124, 126, 142, 144, 146, the torque tube 106 can be rotated during daily operation to adjust the position of the crossbeam 104 and other cross-pieces. This in turn changes the orientation of the concentrator elements 122, 124, 126, 142, 144, 146, which can be positioned to advantageously and desirably receive as much sunlight as possible.

Figure 3:
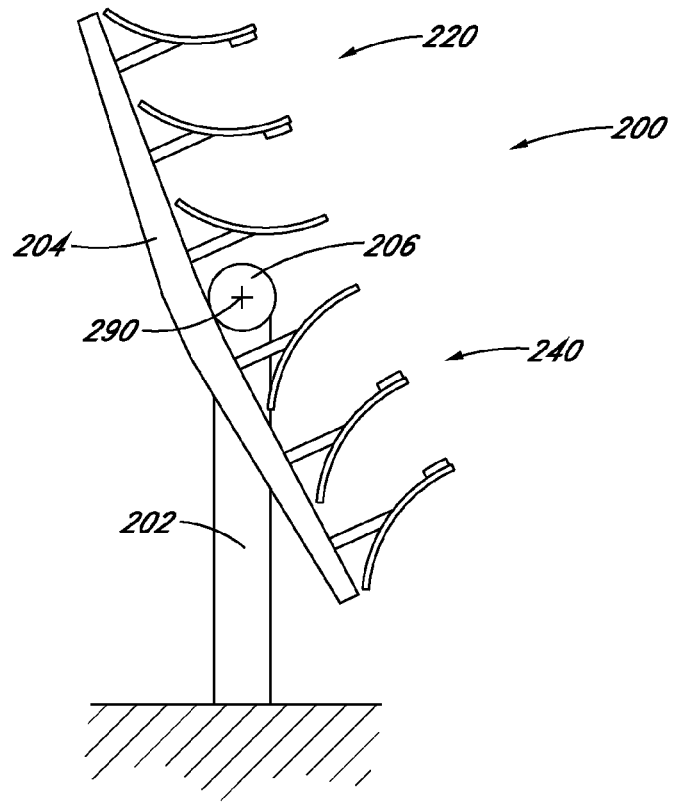
FIG. 3 is a side view of an embodiment of a solar concentrator system in a rotated position.
Figure 4:
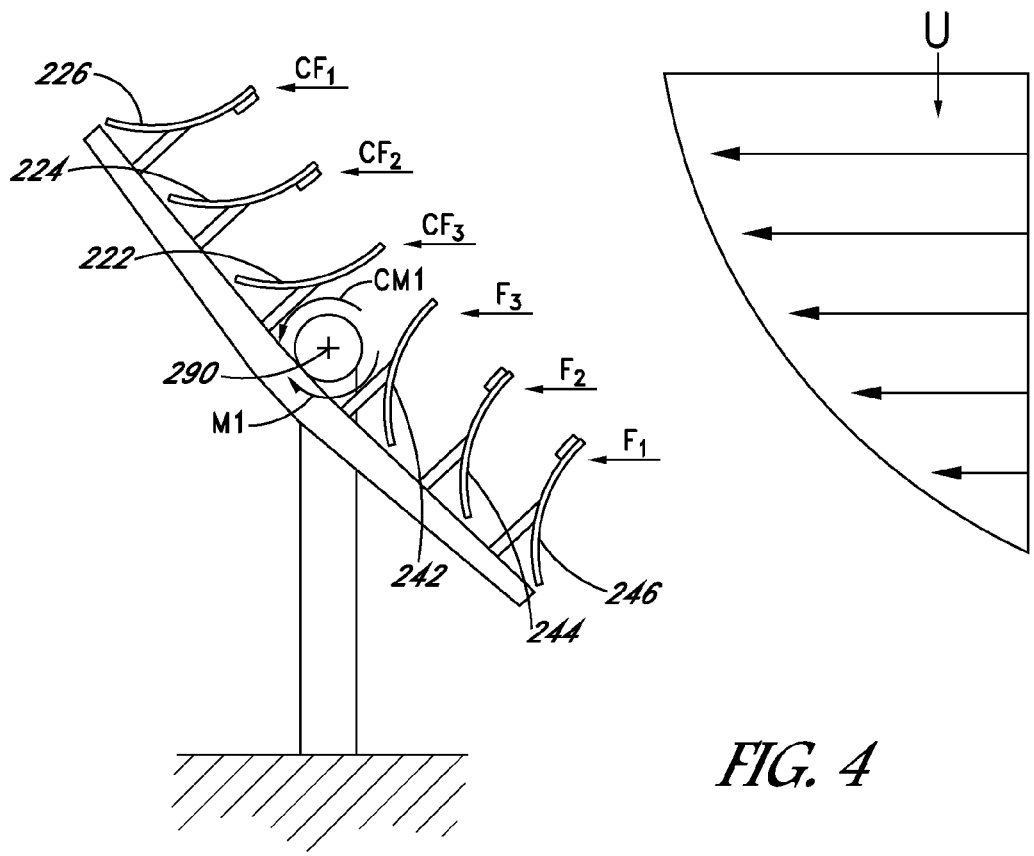
FIG. 4 is a side view of an embodiment of a solar concentrator system in a rotated position under wind loading.

FIGS. 3 and 4 illustrate another embodiment of a solar concentrator assembly 200. Unless otherwise noted, the numerical indicators refer to similar elements as in FIGS. 1 and 2, except that the number has been incremented by 100.

FIG. 3 illustrates a solar concentrator assembly 200 in a first, rotated position. As can be seen, the torque tube 206 has been rotated clockwise, which would correspond to tracking the sun to a position to the right of the post 202. Preferably, the torque tube 206 is rotated by a drive mechanism which is, in turn, operated by a control system. The control system can include a processor, sensors, and other components to track the sun and adjust the orientation of the solar concentrator assembly 200 as desired.

Thus, the orientation shown in FIG. 3 is the result of rotating the solar concentrator assembly 200 to follow the course of the sun through the sky. As can be seen, the solar concentrator assembly 200 rotates around the axis of rotation 290 of the torque tube 206. It is desirable that the center of gravity of the portion of the solar concentrator assembly 200 supported by the torque tube 206 coincide as closely as possible with the axis of rotation 290. This is accomplished by arrangement of the groups of concentrator elements 220, 240 into the assembly shown.

Specifically, the torque tube 206 is positioned between the first and second groups of concentrator elements 220, 240. Each concentrator element in the first group of concentrator elements 220 faces in a different direction than each concentrator element in the second group of concentrator elements 240. Thus, the two concentrator elements 222, 242 nearest the torque tube 206 have their rear sides both facing the torque tube 206. Each concentrator element 222, 242 also has a reflective front side facing away from the torque tube 206. Each concentrator elements in the same group of concentrator elements 220, 240 have the same orientation.

This arrangement of concentrator elements permits the torque tube 206 to be positioned above the crossbeam 204, unlike other concentrator assemblies where the crossbeam 204 is above the torque tube 206. In such assemblies, the center of gravity is offset from the center of rotation of the torque tube 206. Such an offset results in a moment about the center of rotation as the center of gravity is acted on by gravity. This moment introduces torque tube twist, which introduces misalignment and undesirable deformation to the assembly. By positioning the first and second groups of concentrator elements 220, 240 as shown, the torque tube 206 can be positioned to rotate about its axis 290 which is coincident with the center of gravity of the entire assembly.

In some embodiments, the axis of rotation 290 is coincident with the center of gravity of the assembly, while in others, the center of gravity is positioned within the torque tube, although it may be slightly offset from the axis of rotation 290. Preferably, however, any such offset is minimized.

FIG. 4 illustrates the solar concentrator assembly 200 experiencing wind conditions illustrated by profile U. The force of wind experienced at concentrator element 246 is shown as $F_1$. The force of wind experienced at concentrator element 244 is shown as $F_2$. Typically, the wind profile U has a higher velocity with increasing altitude from the ground. Thus, the wind force experienced at concentrator element 226 is higher than the wind force experienced at concentrator element 246. Thus, $F_2$ is typically higher than $F_1$. This relationship continues through $F_3$.

Each force $F_1$, $F_2$, $F_3$ is exerted against a respective concentrator element 246, 244, 242. Because each concentrator element 246, 244, 242 is offset from the axis of rotation 290, a resultant moment $M_1$ is created about the axis of rotation 290. In the relationship illustrated, the moment $M_1$ is clockwise about the axis of rotation 290. The magnitude of the moment $M_1$ is determined in part by the velocity of the wind profile U, but also by the apparent cross-section of the concentrator elements 246, 244, 242 against which the wind forces $F_1$, $F_2$, $F_3$ are exerted. As can be seen, the clockwise rotation of the solar concentrator assembly 200 positions the second group of concentrator elements 240 to present a larger cross-section to the wind profile U.

In addition to the benefit of permitting the torque tube 206 to be positioned above the crossbeam 204 and, therefore, the axis of rotation 290 coincident with the center of gravity, by arranging the concentrator elements as shown, the profile of the first group of concentrator elements 220 is turned into the wind profile U such that only a cross-section of the concentrator elements 222, 224, 226 is exposed to the wind profile U. The counterforce $CF_1$ exerted by the wind profile U against the concentrator element 226 contributes to a counter-moment $CM_1$ which is in the opposite direction to the moment $M_1$. Accordingly, the moment $M_1$ is resisted in part by the forces $CF_1$, $CF_2$, and $CF_3$ experienced by concentrator elements 226, 224, 222, respectively.

Most desirably, the counter-moment $CM_1$ would be equal in magnitude to the moment $M_1$, but in the opposite direction, resulting in only drag wind loads being imparted to the torque tube 206. The arrangement and orientation of concentrator elements as shown contributes to equalizing the magnitudes of $M_1$ and $CM_1$. This is because the higher-elevated first group of concentrator elements 220 experiences higher wind forces $CF_1$, $CF_2$, $CF_3$ because they are higher in the wind profile U. The cross-section presented by the first group of concentrator elements 220 is, however, smaller than that presented by the second group of concentrator elements 220. The balance between the higher force and smaller cross-section of the first group of concentrator elements 220 and the lower force, but larger cross-section of the second group of concentrator elements 240 minimizes, reduces, and inhibits unequal moments $M_1$ and $CM_1$, thereby reducing the moment experienced by the torque tube 206. This is another advantage of the arrangement illustrated in FIGS. 1-4, in addition to the inhibition of torque tube twist.

FIG. 5 illustrates a detailed view of a portion of a solar concentrator assembly 300. Unless otherwise noted, the numerical indicators refer to similar elements as in FIGS. 1 and 2, except that the number has been incremented by 200.

The sun 360 radiates sunlight 362. The concentrated sunlight 362 is reflected by concentrator element 322 as concentrated sunlight 364 toward the first solar receiver 332. A top edge of concentrated sunlight 366 travels from the top edge of the concentrator element 322 a certain distance to reach the first solar receiver 332. A bottom edge of concentrated sunlight 368 travels a different distance from the bottom edge of the concentrator element 322 to reach the first solar receiver 332. It is desirable that the top edge of concentrated sunlight 366 travel downward as little as possible while covering the distance to the first solar receiver 332. Similarly, it is desirable that the bottom edge of concentrated sunlight 368 travel to the first solar receiver 332 as vertically as possible, reducing forward travel toward the adjacent concentrator element 324. The result of these desirable improvements is that the band of focused sunlight impinging on a solar receiver has an even profile, with reduced or eliminated variation in intensity.

It should be understood that although the top and bottom edges of concentrated sunlight 366, 368 are illustrated impinging on substantially entirely the face of the first solar receiver 332, in practice, the band of concentrated sunlight can be narrower and focused on a solar cell positioned at a desired location on the face. Thus, a narrow band of concentrated sunlight can be reflected to the middle of the first solar receiver 332 and, preferably, to the middle of the solar cell. If the concentrated sunlight band impinges only on a middle portion of the solar cell, small misalignment errors will have a reduced effect on efficiency as the concentrated sunlight will still impinge the solar cell, even if slightly off target.

The inventors have discovered that offsetting at least some of the concentrator elements 322, 324, 326 in a vertical direction as they proceed outward from the torque tube 306 permits advantageous geometrical characteristics to the reflector/receiver arrangement over concentrator elements positioned at the same height relative to one another. Thus, the first concentrator element 322 is positioned at a height of $h_1$. The second concentrator element 324 is offset vertically to a height of $h_2$, which is greater than $h_1$. The third concentrator element 326 is offset vertically to a height of $h_3$, which is, in turn, greater than $h_2$. These heights are measure relative to the reference height of the bottom of the reflector component of concentrator element 322.

Angle $\alpha$ is indicative of the angle of constant vertical offset of the concentrator elements from a horizontal axis, as shown. Accordingly, angle $\alpha$ has a value greater than 0°, preferably approximately 5°. Thus, the exact value of the height difference can vary between embodiments so long as a consistent offset is used. In some embodiments, a non-linear offset can be used, such that the value of difference between $h_1$ and $h_2$ can be greater than the value of the difference between $h_1$ and $h_0$. For concentrators spaced equally in the horizontal direction, a non-linear arrangement results.

The solar receivers 332, 334 can be have a different orientation when coupled to concentrator elements 322, 324, 326 offset in a vertical direction than when coupled to concentrator elements without the vertical offset. The different orientation can be solely a rotation about an axis extending through a portion of the receiver, or can be or include a translation in the horizontal or vertical directions, in some embodiments. Preferably, however, a solar receiver does not protrude beyond the overhanging upper portion of the concentrator element to which it is coupled, and therefore does not cast a shadow on a portion of the concentrator element below.

Additionally, the cross-sectional shape of the concentrator elements 322, 324, 326 can be altered from a shape used for concentrator elements without a vertical offset. Although both shapes can have a parabolic characteristic, those concentrator elements 322, 324, 326 vertically offset can have a slope which reflects light collectively more upwardly than a reflective surface of concentrator elements without vertical offset.

The height difference between the concentrator elements need not display a similar height difference from a horizontal crossbeam 304. As shown, the crossbeam 304 can have an upward cant substantially the same as angle α, or, in some embodiments, it can be horizontal. Similarly, cross-pieces of the solar concentrator assembly 300 can have a similar shape as the crossbeam 304, or a different one.

Figure 6:
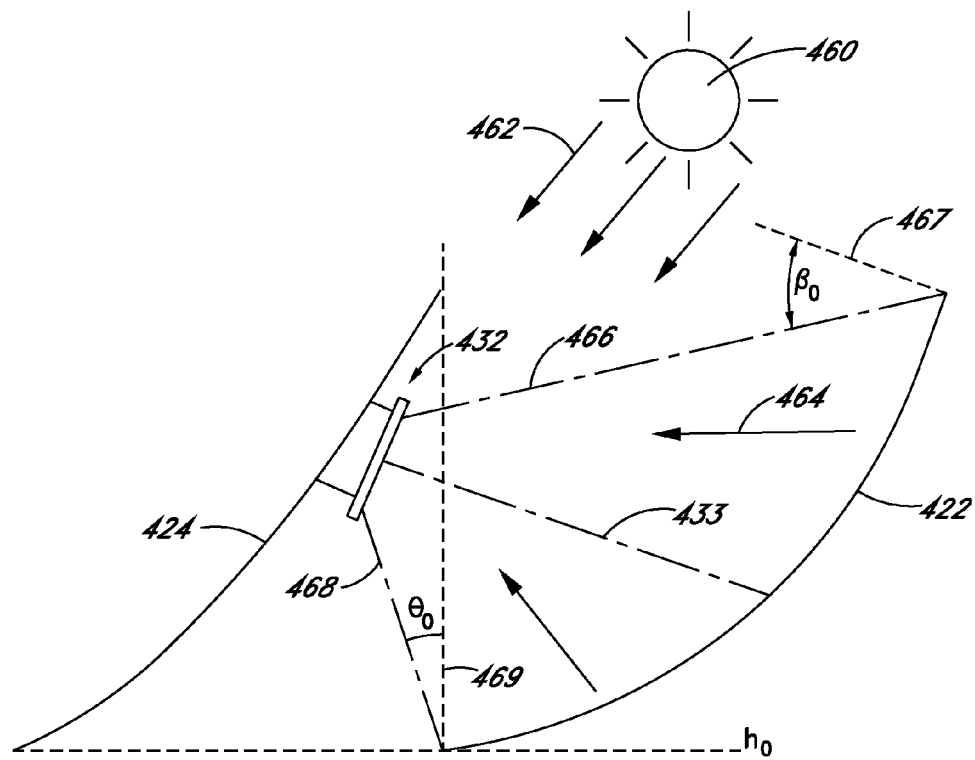
FIG. 6 is a side view of a portion of an embodiment of a solar concentrator array.

FIG. 6 illustrates a detailed view of a portion of a solar concentrator assembly 400. Unless otherwise noted, the numerical indicators refer to similar elements as in FIGS. 1 and 2, except that the number has been incremented by 300.

FIG. 6 illustrates an embodiment in which the two concentrator elements depicted 422, 424 are at the same height $h_0$, or without vertical offset. Three additional reference lines are added to illustrate principles discovered by the inventors to advantageously increase efficiency of the solar concentrator assembly. First, a lower edge normal 469 is shown extending upwardly in a direction normal to, and from, the lower edge of the reflective side of the first concentrator element 422. The lower edge of the reflective side of the first concentrator element 422 is preferably in a vertically-extending plane with the upper edge of the second concentrator element 424. In this way, no sunlight is lost between the concentrator elements 422, 424. The bottom edge of concentrated sunlight 468 forms an angle $\theta_0$ with the lower edge normal 469.

The first solar receiver 432 is shown mounted to the rear side of the second concentrator element 424. A mounting component in addition to a solar panel or cell portion can comprise the solar receiver 432, as explained above. The solar receiver 432 receives the bottom edge of concentrated sunlight 468 at an angle, which depends on both the tilt of the solar receiver 432 and the parabolic shape of the reflective side of the concentrator element 422. Preferably, the angle $\theta_0$ is minimized to avoid inefficient sunlight transfer between the concentrator element 422 and the solar receiver 432. Such inefficiency can occur when concentrated sunlight 464 travels through a glass surface of the solar receiver 432. Even with anti-reflective coating, some scattering is unavoidable, and should be minimized to reduce the inefficiency of light travel through the surface of the solar receiver 432.

The solar receiver 432 has a normal direction 433 which is located at a right angle to the plane of the receiving surface of the solar receiver 432. The normal direction 433 is preferably directed at the center of sunlight received from the concentrator element 422. The center of sunlight is not necessarily the geometric center of the parabolic shape of the reflective surface of the concentrator element 422, but instead is a weighted average of sunlight from the entire reflective surface of the concentrator element 422. As concentrated sunlight 464 is more directly received from the lower portion of the reflective surface, the value of sunlight from this region is increased relative to, for example, concentrated sunlight 464 received at the solar receiver 432 from near the top edge of concentrated sunlight 466. Accordingly, the normal direction 433 typically is positioned more towards the bottom edge 468 than the top edge 466 of concentrated sunlight.

Additionally, light that impinges on the surface of the solar receiver 432 at a smaller angle to the normal direction 433 is more efficient than light which arrives at a larger angle to the normal direction 433. Thus, light which has a smaller incident angle to the surface of the solar receiver 432 is more desirable. In some embodiments, an anti-reflective coating can be applied to the surface of the solar receiver 432. One advantage to decreasing the incident angle of concentrated sunlight 464 arriving at the surface of the solar receiver 432 is that anti-reflective coating can be omitted without reducing efficiency, resulting in a cost savings.

Finally, an upper edge normal 467 extends perpendicularly to the reflective surface at the top edge of the concentrator element 422 as shown. The top edge of concentrated sunlight 466 forms an angle $\beta_0$ with the upper edge normal 467. It is desirable to reduce the angle $\beta_0$ for reasons similar to the advantage to reducing angle $\theta_0$. Moreover, unconcentrated sunlight 462 is reflected by the reflective surface of concentrator element 422 increasingly, that is, with less scattered light, as angle $\theta_0$ decreases.

Figure 7:
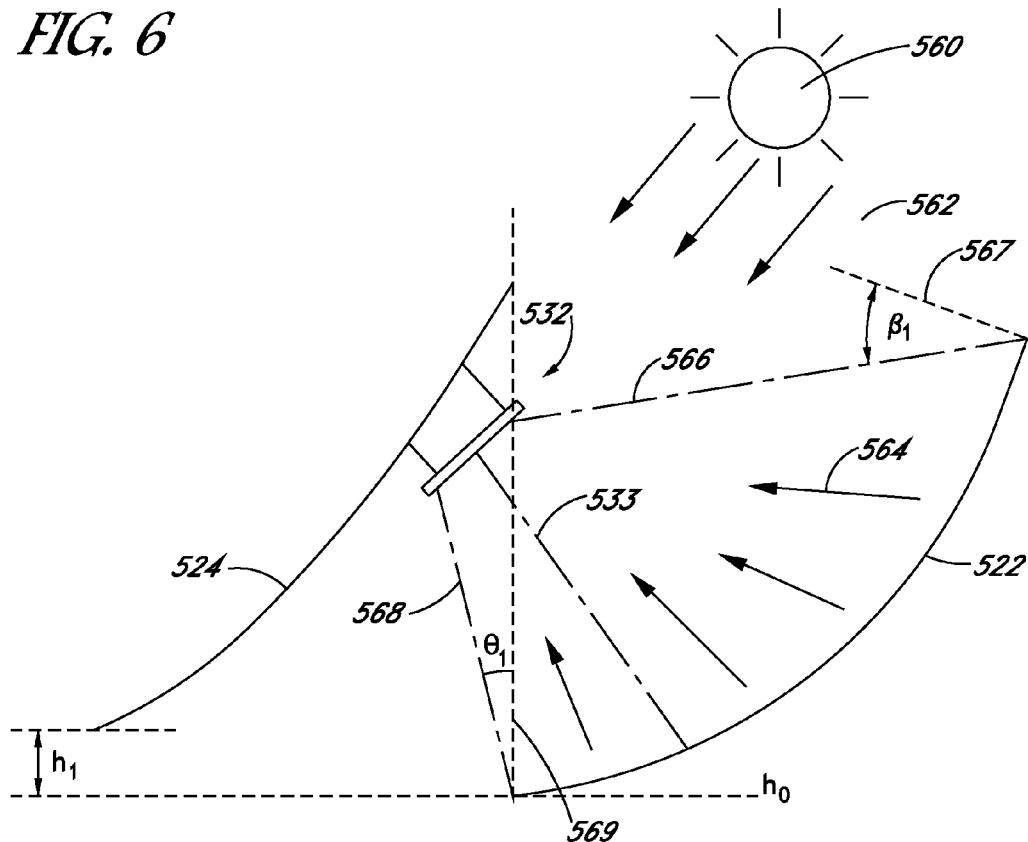
FIG. 7 is a side view of a portion of another embodiment of a solar concentrator array.

FIG. 7 illustrates a detailed view of a portion of a solar concentrator assembly 500. Unless otherwise noted, the numerical indicators refer to similar elements as in FIG. 6, except that the number has been incremented by 100.

In FIG. 7, the second concentrator element 524, to which the solar receiver 532 is mounted, has been vertically offset to a height $h_1$. This vertical offset has an advantageous effect on each of the three characteristics described above with respect to FIG. 6. FIGS. 6 and 7 are not to scale and distances or angles may be exaggerated to values either larger than actual measures or proportions or smaller for descriptive purposes.

First, the angle $\theta_1$ has been reduced. For reasons presented above, this increases efficiency of the solar receiver 532 by adjusting the angle concentrated sunlight 564 at or near the bottom edge of concentrated sunlight 568 travels through the surface of the solar receiver 532. Additionally, the reflectance of the mirrored surface of the solar concentrator 522 is increased because the incident angle of unconcentrated sunlight 562 is decreased.

Second, to continue to direct the normal direction 533 at the weighted average center of concentrated sunlight 564 from the reflective surface of the concentrator element 522, the angle of the surface of the solar receiver facing concentrator element 522, and receiving concentrated sunlight 564 therefrom, has been changed downward. Accordingly, the normal direction 533 has also been directed downward relative to the position in FIG. 6. Additionally, the shape of the reflective surface of the concentrator element 522 has been adjusted to a different parabolic shape which directs concentrated sunlight 564 in a greater concentration towards the bottom edge 568 than that of FIG. 6. This is advantageous for reasons similar to the benefit that results from a smaller angle $\theta_1$.

Third, angle $\beta_1$ is likewise reduced. This additionally increases the efficiency of the solar concentrator assembly. Similarly to how decreasing angle $\theta_1$ improves the reflectivity of the surface of the concentrator element 522 for sunlight reflected near the lower edge, the decreasing angle $\beta_1$ increases the reflectivity of the minor near the upper edge. This increase in reflectivity results in more concentrated sunlight 564 reflected toward the solar receiver 532 from near the upper edge. Moreover, these effects extend across the face of the entire reflective surface of the concentrator element 522, improving reflectance of the unit as a whole.

In addition to these three exemplary advantages which result from the vertical offset of the concentrator elements, the solar receiver 532 can be enlarged, as shown in FIGS. 6 and 7, while maintaining the same approximate position relative to the surface of the solar concentrator 522. This is increased size of the solar receiver 532 can enable sizing changes or additional components to be added to the solar receiver 532. For example, a larger heat sink can be incorporated into the solar receiver 532. A larger heat sink can reduce the operating temperature of the solar cell included in the solar receiver 532. By decreasing the operating temperature, the efficiency of the solar cell can be increased, resulting in an overall performance improvement to the system.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solar concentrator assembly comprising:
   a first reflective device having a first reflective front side and a first rear side;
   a second reflective device having a second reflective front side and a second rear side, the second reflective device positioned such that the first reflective front side faces the second rear side; and
   a support assembly coupled to and supporting the first and second reflective devices, the second reflective device positioned to be vertically offset from the first reflective device, wherein the support assembly comprises a crossbeam supporting the first and second reflective devices and the second reflective device is further from the crossbeam than the first reflective device.

2. The solar concentrator assembly of claim 1, further comprising a third reflective device having a third reflective front side and a third rear side, the third reflective device positioned such that the second reflective front side faces the third rear side.

3. The solar concentrator assembly of claim 2, wherein the third reflective device is coupled to and supported by the support assembly, and positioned to be vertically offset from the second reflective device.

4. The solar concentrator assembly of claim 1, wherein the first reflective front side has a parabolic shape.

5. A solar concentrator assembly comprising:
   a first reflective device having a first reflective front side and a first rear side;
   a second reflective device having a second reflective front side and a second rear side, the second reflective device positioned such that the first reflective front side faces the second rear side;
   a third reflective device having a third reflective front side and a third rear side, the third reflective device positioned such that the second reflective front side faces the third rear side; and
   a support assembly coupled to and supporting the first and second reflective devices, the second reflective device positioned to be vertically offset from the first reflective device, wherein the third reflective device is coupled to and supported by the support assembly and positioned to be vertically offset from the second reflective device, and wherein the support assembly comprises a crossbeam supporting the first, second, and third reflective devices and the second reflective device is further from the crossbeam than the first reflective device, and the third reflective device is further from the crossbeam than the second reflective device.

6. A solar concentrator assembly comprising:
   a first reflective device having a first reflective front side and a first rear side;
   a second reflective device having a second reflective front side and a second rear side, the second reflective device positioned such that the first reflective front side faces the second rear side;
   a support assembly coupled to and supporting the first and second reflective devices, the second reflective device positioned to be vertically offset from the first reflective device; and a rotational assembly behind the first rear side of the first reflective device, the rotational assembly comprising a torque tube.

7. The solar concentrator assembly of claim 6, further comprising a fourth reflective device having a fourth reflective front side and a fourth rear side, the rotational assembly behind the fourth rear side, the first and fourth reflective front sides facing in opposite directions.

8. A solar concentrator assembly comprising:
   a torque tube having a long axis;
   a crossbeam extending in a direction transverse to the long axis;
   a first reflective device having a first reflective surface facing outward from the torque tube and a first rear side facing toward the torque tube, the first reflective device supported by the crossbeam at a first height; and
   a second reflective device having a second reflective surface facing outward from the torque tube, the second reflective device positioned in front of the first reflective surface and supported by the crossbeam at a second height, the second height greater than the first height.

9. The solar concentrator assembly of claim 8, wherein the second reflective device further comprises:
   a second rear side facing the first reflective surface; and
   a first solar receiver positioned on the second rear side to receive concentrated sunlight from the first reflective surface.

10. The solar concentrator assembly of claim 8, further comprising a third reflective device facing outward from the torque tube, the third reflective device positioned in front of the second reflective surface and supported by the crossbeam at a third height, the third height greater than the second height.

11. The solar concentrator assembly of claim 10, wherein the third reflective device further comprises:
    a third rear side facing the second reflective surface; and
    a second solar receiver positioned on the third rear side to receive concentrated sunlight from the second reflective surface.

12. The solar concentrator assembly of claim 11, further comprising a fourth reflective device having a fourth reflective surface, the fourth reflective device positioned on the crossbeam on another side of the torque tube from the first, second, and third reflective devices and facing an opposite direction from the first, second, and third reflective devices.

13. The solar concentrator assembly of claim 12, wherein the fourth reflective device is positioned at a height substantially equal to the first height.

14. The solar concentrator assembly of claim 13, further comprising a fifth reflective device facing outward from the torque tube, the fifth reflective device positioned in front of the fourth reflective surface and supported by the crossbeam at the second height.

15. The solar concentrator assembly of claim 14, wherein the fifth reflective device further comprises:

a fifth rear side facing the fourth reflective surface; and a third solar receiver positioned on the fifth rear side to receive concentrated sunlight from the fourth reflective surface.

16. The solar concentrator assembly of claim 15, wherein the solar concentrator array has a center of gravity, the center of gravity positioned within the torque tube.

* * * * *